(12) United States Patent
Miyazaki et al.

(10) Patent No.: US 9,679,644 B2
(45) Date of Patent: Jun. 13, 2017

(54) SEMICONDUCTOR STORAGE DEVICE AND DRIVING METHOD OF THE SAME (71) Applicant: Kabushiki Kaisha Toshiba, Minato-ku (JP)

(72) Inventors: Takayuki Miyazaki, Setagaya (JP); Reika Ichihara, Yokohama (JP); Kikuko Sugimae, Kuwana (JP); Yoshihisa Iwata, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/834,908

(22) Filed: Aug. 25, 2015

(65) Prior Publication Data

US 2016/0267974 A1 Sep. 15, 2016

(30) Foreign Application Priority Data

Mar. 12, 2015 (JP) .................. 2015-050034

(51) Int. Cl.
*G11C 13/00* (2006.01)
*G11C 7/12* (2006.01)

(52) U.S. Cl.
CPC ............ *G11C 13/0069* (2013.01); *G11C 7/12* (2013.01); *G11C 13/004* (2013.01); *G11C 13/0023* (2013.01); *G11C 13/0026* (2013.01); *G11C 2013/0052* (2013.01); *G11C 2013/0054* (2013.01); *G11C 2013/0073* (2013.01); *G11C 2213/77* (2013.01)

(58) Field of Classification Search
CPC .................. G11C 13/0038; G11C 13/0069
USPC ........................................... 365/148
See application file for complete search history.

(56) References Cited

U.S. PATENT DOCUMENTS

| | | | |
|---|---|---|---|
| 7,898,840 B2 | 3/2011 | Maejima | |
| 8,149,611 B2 | 4/2012 | Maejima | |
| 8,289,749 B2 * | 10/2012 | Chen .................. | G11C 13/0007 365/148 |
| 8,432,722 B2 | 4/2013 | Maejima | |
| 8,462,580 B2 * | 6/2013 | Rabkin .............. | G11C 13/0007 365/148 |
| 8,514,622 B2 * | 8/2013 | Widjaja ........................ | 365/182 |

(Continued)

FOREIGN PATENT DOCUMENTS

JP 2009-266304 11/2009

*Primary Examiner* — Hoai V Ho
*Assistant Examiner* — Muna A Techane
(74) *Attorney, Agent, or Firm* — Oblon, McClelland, Maier & Neustadt, L.L.P.

(57) ABSTRACT

A semiconductor storage device includes a variable resistive element, which changes a resistance value according to a polarity and a magnitude of an applied voltage, as a memory element. The semiconductor storage device includes a standby mode in which a power source voltage or a ground voltage is applied to both of a word line and a bit line. The semiconductor storage device includes a data write mode in which a voltage difference equal to or more than a first voltage is applied between the word line and the bit line. The semiconductor storage device includes a read mode in which a voltage difference smaller than the first voltage is applied between the word line and the bit line by changing only one voltage of the word line and the bit line which is applied in the standby mode, and data written in the memory element is read.

17 Claims, 8 Drawing Sheets

(56) References Cited

U.S. PATENT DOCUMENTS

2011/0299340 A1* 12/2011 Samachisa ............. G11C 16/06
                                                    365/185.21
2014/0254242 A1*  9/2014 Siau .................. G11C 13/0026
                                                    365/148

* cited by examiner

SEMICONDUCTOR STORAGE DEVICE AND DRIVING METHOD OF THE SAME

CROSS-REFERENCE TO RELATED APPLICATIONS

This application is based upon and claims the benefit of priority from Japanese Patent Application No. 2015-50034, filed on Mar. 12, 2015; the entire contents of which are incorporated herein by reference.

FIELD

Embodiments described herein relate generally to a semiconductor storage device and a driving method of the same.

BACKGROUND

Conventionally, there is disclosed a technique for semiconductor storage device which uses a variable resistive element as a memory element. The variable resistive element changes a resistance value according to a value of an applied voltage, a polarity of the applied voltage, or an application time. A difference of the resistance value is assigned to data "0" or "1" so that the variable resistive element can be used as the memory element.

In the related art, in a case where data written in the variable resistive element is read, or in a case where data is written in the variable resistive element, the data is read or written in a state where the potential of all the word lines and all the bit lines is increased up to a predetermined voltage (that is, a pre-charge state). However, since it takes a time for the pre-charge, it needs a time until the data is read and written. In addition, it is desirable that power consumed in the pre-charge state from a standby mode until the data is read or written be reduced.

DETAILED DESCRIPTION

In general, a semiconductor storage device according to an embodiment is provided with a variable resistive element as a memory element. The variable resistive element is connected between a word line and a bit line to change a resistance value according to a polarity of a voltage applied between the word line and the bit line and a magnitude of the voltage. The semiconductor storage device includes a standby mode in which a power source voltage on a high potential side or a ground voltage is applied to both of the word line and the bit line. The semiconductor storage device includes a data write mode in which data is written to the memory element by applying a voltage difference equal to or more than a first voltage between the word line and the bit line so as to change a resistance value of the memory element. The semiconductor storage device includes a read mode in which data written in the memory element is read by changing only one voltage of the word line and the bit line which is applied in the standby mode so as to apply a voltage difference smaller than the first voltage between the word line and the bit line.

Exemplary embodiments of a semiconductor storage device and a driving method thereof will be explained below in detail with reference to the accompanying drawings. The present invention is not limited to the following embodiments.

First Embodiment

Figure 1:
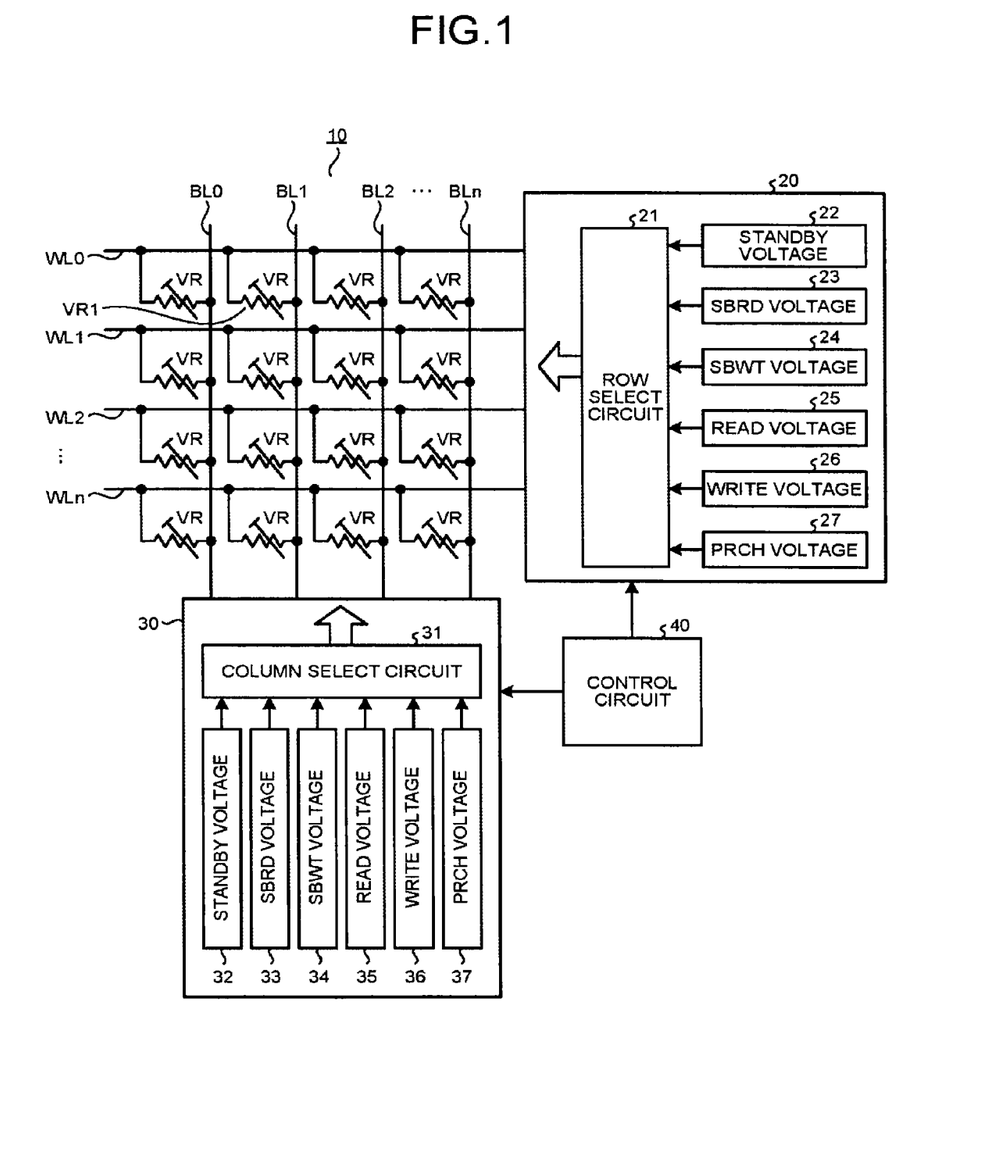
FIG. 1 is a diagram illustrating a configuration of a semiconductor storage device of a first embodiment.

FIG. 1 is a diagram illustrating a configuration of a semiconductor storage device of a first embodiment. The semiconductor storage device of this embodiment includes a memory cell array 10. The memory cell array 10 includes a plurality of bit lines (BL0 to BLn) and a plurality of word lines (WL0 to WLn). A variable resistive element VR is connected between each bit line and each word line.

As the variable resistive element VR, for example, a bipolar variable resistive element may be used which can be set in its state to be a high resistive state or a low resistive state by changing a polarity of a voltage applied between the electrodes of the variable resistive element. Further, a variable resistive element may be used which forms a conducting bridge between the electrodes by precipitating metal cations or changes a resistance value by ionizing the precipitated metal to break the conducting bridge.

This embodiment includes a row control circuit 20. The row control circuit 20 includes voltage generation circuits (22 to 27) which generate voltages according to each operation mode of the semiconductor storage device. A standby voltage generation circuit 22 generates a voltage standby voltage in a standby mode. For example, a power source voltage VDD on the high potential side or a ground voltage VSS can be used as the standby voltage.

A standby read voltage generation circuit 23 generates a voltage SBRD voltage in a standby read (hereinafter, referred to as SBRD) mode. The SBRD mode will be described below. As the SBRD voltage, for example, a voltage lower than the power source voltage VDD by a predetermined voltage or a voltage higher than the ground voltage VSS by a predetermined voltage is used. A voltage difference between the SBRD voltage and the power source voltage VDD or a voltage difference between the SBRD voltage and the ground voltage VSS is used as a voltage to read data of a selected memory cell (hereinafter, referred to as a select memory cell). In a case where the SBRD voltage is applied to a select memory cell VR1, the SBRD voltage is set to a voltage such that the resistance value of the select memory cell VR1 is not changed to prevent the data from being destroyed. A standby write voltage generation circuit 24 generates a voltage SBWT voltage in a standby write (hereinafter, referred to as SBWT) mode. The SBWT will be described below. A read voltage generation circuit 25 generates a voltage READ voltage in a read operation. A write voltage generation circuit 26 generates a voltage WRITE voltage in a write operation. A pre-charge voltage generation circuit 27 generates a voltage PRCH voltage in a pre-charging operation. The PRCH voltage, for example, is set to an intermediate voltage between the power source voltage VDD and the ground voltage VSS.

This embodiment includes a row select circuit 21. The row select circuit 21 applies a voltage of the voltage generation circuit (22 to 27) to the word line (WL0 to WLn) selected according to the operation mode of the semiconductor storage device by the control of a control circuit 40.

This embodiment includes a column control circuit 30. The column control circuit 30 includes the voltage generation circuits (32 to 37) which generate a voltage according to each operation mode of the semiconductor storage device. The standby voltage generation circuit 32 generates a voltage standby voltage in the standby mode. For example, the power source voltage VDD on the high potential side or the ground voltage VSS can be used as the standby voltage. The SBRD voltage generation circuit 33 generates a voltage SBRD voltage in the SBRD mode. As the SBRD voltage, a voltage lower than the power source voltage VDD by a predetermined voltage or a voltage higher than the ground voltage VSS by a predetermined voltage is used. The standby write voltage generation circuit 34 generates a voltage SBWT voltage at the time of the SBWT. The read voltage generation circuit 35 generates a voltage READ voltage in the read operation. The write voltage generation circuit 36 generates a voltage WRITE voltage in the write operation. The pre-charge voltage generation circuit 37 generates a voltage PRCH voltage in the pre-charging operation. The PRCH voltage, for example, is set to an intermediate voltage between the power source voltage VDD and the ground voltage VSS.

In the standby mode, the standby voltage is applied to all the word lines and all the bit lines from the row select circuit 21 and a column select circuit 31. For example, the power source voltage VDD on the high potential side or one voltage in the ground voltage VSS is applied to all the word lines and all the bit lines.

In the SBRD mode, without entering a pre-charge state, the SBRD voltage is applied to the word line (hereinafter, referred to as a select word line) connected to the select memory cell and the bit line (hereinafter, referred to as a selected bit line) connected to the select memory cell from the row select circuit 21 and the column select circuit 31. For example, in a case where the memory cell VR1 connected to a word line WL0 and a bit line BL1 is selected in a state where the ground voltage VSS is applied to all the word lines and all the bit lines in the standby mode, only the voltage of a select word line WL0 connected to the select memory cell VR1 is increased and the SBRD voltage is applied to the select memory cell VR1. In other words, only the voltage of the select word line WL0 is increased, and the voltage SBRD voltage is applied to the select memory cell VR1 in order to read data. Since only the voltage of the select word line WL0 is increased, the voltage can be increased in a short time. In addition, since only the select word line WL0 is increased without entering the pre-charge state, the pre-charge state until the transition to the SBRD is eliminated, and power consumption can be reduced. Further, in a case where the power source voltage VDD on the high potential side is applied to all the word lines and all the bit lines in the standby mode, the SBRD voltage is applied, in the SBRD, the SBRD voltage being lower than the power source voltage VDD by a voltage necessary for reading the data from the select memory cell VR1 to a select bit line BL1 connected to the select memory cell VR1. Therefore, the SBRD voltage is applied to the select memory cell VR1.

In a SBWT mode, the SBWT voltage is applied to the select word line WL0 and the select bit line BL1 from the row select circuit 21 and the column select circuit 31 without entering the pre-charge state. For example, in a case where the memory cell VR1 connected to the word line WL0 and the bit line BL1 is selected in a state where the ground voltage VSS is applied to all the word lines and all the bit lines in the standby mode, only the voltage of the select word line WL0 connected to the select memory cell VR1 is increased and the SBWT voltage is applied to the select memory cell VR1. In other words, only the voltage of the select word line WL0 is increased, and the voltage SBWT voltage is applied to the select memory cell VR1 in order to read data. Since only the voltage of the select word line WL0 is increased, the voltage can be increased in a short time. In addition, since only the select word line WL0 is increased without entering the pre-charge state, the pre-charge state until the transition to the SBWT mode is eliminated, and the power consumption can be reduced. Further, the writing of data in the SBWT mode, for example, can be used in a case where the data having a low voltage for the writing of data "0" or "1" to the variable resistive element VR is written.

In the semiconductor storage device of this embodiment, since the SBRD mode is used to read the data out of the select memory cell VR1 without entering the pre-charge state, a rapid read operation can be performed. In addition, since only the voltage of the select word line WL0 is increased in the SBRD mode, the power consumption can be reduced compared to a case where the read operation is performed through the pre-charge state. Further, the voltage generation circuits (22 to 27) of the row control circuit 20 and the voltage generation circuits (32 to 37) of the column control circuit 30 are described as the individual voltage generation circuit which generates a predetermined voltage according to each operation for convenience' sake, but may be a circuit configuration which generates the standby voltage, the SBRD voltage, the SBWT voltage, the READ voltage, the WRITE voltage, or the PRCH voltage according to the control of the control circuit 40.

Second Embodiment

Figure 2:
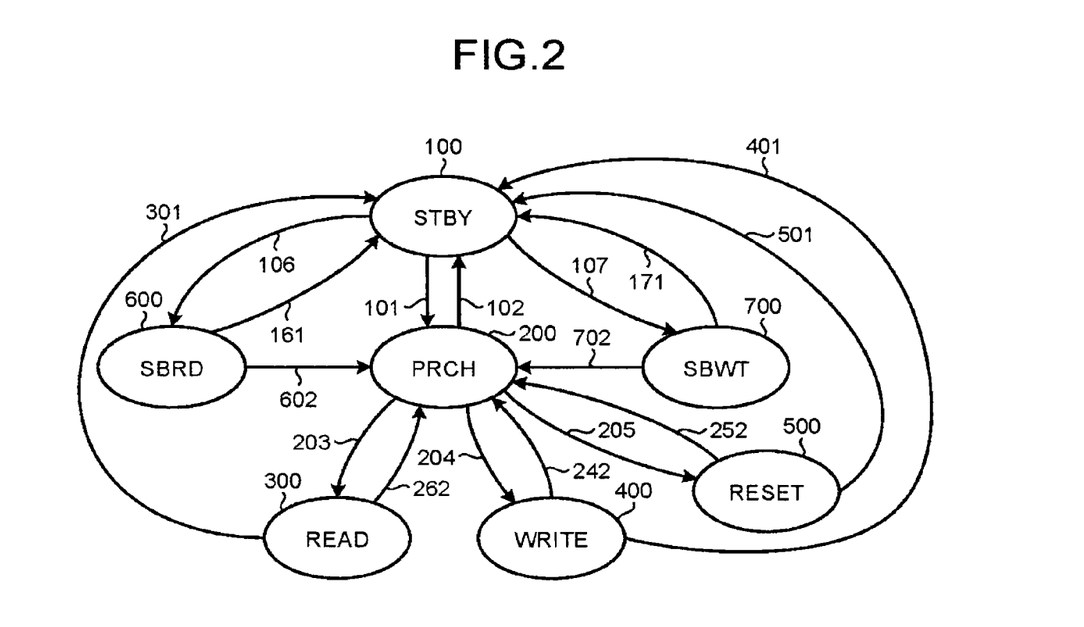
FIG. 2 is a diagram for describing a driving method of a semiconductor storage device of a second embodiment.

FIG. 2 is a diagram for describing a driving method of a semiconductor storage device of a second embodiment. The driving method is illustrated in a state transition diagram. In this embodiment, a mode (106) of directly transitioning from a standard mode (100) to the SBRD mode (600) where the data of the select memory cell is read is included. In the SBRD mode (600), only the voltage of one of the select word line connected to the select memory cell or the select bit line connected to the select memory cell is changed to read the data of the select memory cell. Further, a mode (161) of transitioning from the SBRD mode (600) to the standby mode (100) is included, and a mode (602) of transitioning from the SBRD mode (600) to a pre-charge state (200) is included.

In this embodiment, a mode (107) of directly transitioning from the standby mode (100) to the SBWT mode (700) where the data is written to the select memory cell is included. In the SBWT mode (700), only the voltage of one of the select word line connected to the select memory cell and the select bit line connected to the select memory cell is changed to write the data to the select memory cell. A mode (171) of transitioning from the SBWT mode (700) to the standby mode (100) is included, and a mode (702) of transitioning from the SBWT mode (700) to the pre-charge state (200) is included.

In this embodiment, a mode (203) of transitioning from the pre-charge state (200) to a read operation (300) is included. A mode (262) of transitioning from the read operation (300) to the pre-charge state (200) is included, and a mode (301) of transitioning from the read operation (300) to the standby mode (100) is included.

In this embodiment, a mode (204) of transitioning from the pre-charge state (200) to a write operation (400) is included. A mode (242) of transitioning from the write operation (400) to the pre-charge state (200) is included, and a mode (401) of transitioning from the write operation (400) to the standby mode (100) is included.

In this embodiment, a mode (101) of transitioning from the standby mode (100) to the pre-charge state (200) is included, and a mode (102) of transitioning from the pre-charge state (200) to the standby mode (100) is included.

In this embodiment, a reset mode (500) of resetting the data of all the memory cells is included. For example, a mode (205) of transitioning to the reset mode (500) through the pre-charge state (200) is included, and a mode (252) of transitioning to the pre-charge state (200) after the reset mode (500) is included. In addition, a mode (501) of transitioning to the standby mode (100) after the reset mode (500) is included. For example, "0" is written to all the memory cells by supplying a WRITE voltage to write data "0" to all the memory cells from the row select circuit 21 and the column select circuit 31 to the word line (WL0 to WLn) and the bit line (BL0 to BLn), and so that all the memory cells can be reset.

In this embodiment, the SBRD mode (600) of directly reading the data of the select memory cell VR1 without entering the pre-charge state (200) is included, and the SBWT mode (700) of directly writing the data to the select memory cell VR1 is included. Therefore, the data can be rapidly read out of the select memory cell VR1, and the data can be rapidly written to the select memory cell. Further, the transition to each mode can be made by supplying a voltage corresponding to each mode to each of the word lines (WL0 to WLn) and the bit lines (BL0 to BLn) through the row select circuit 21 and the column select circuit 31 under the control of the control circuit 40.

Third Embodiment

Figure 3:
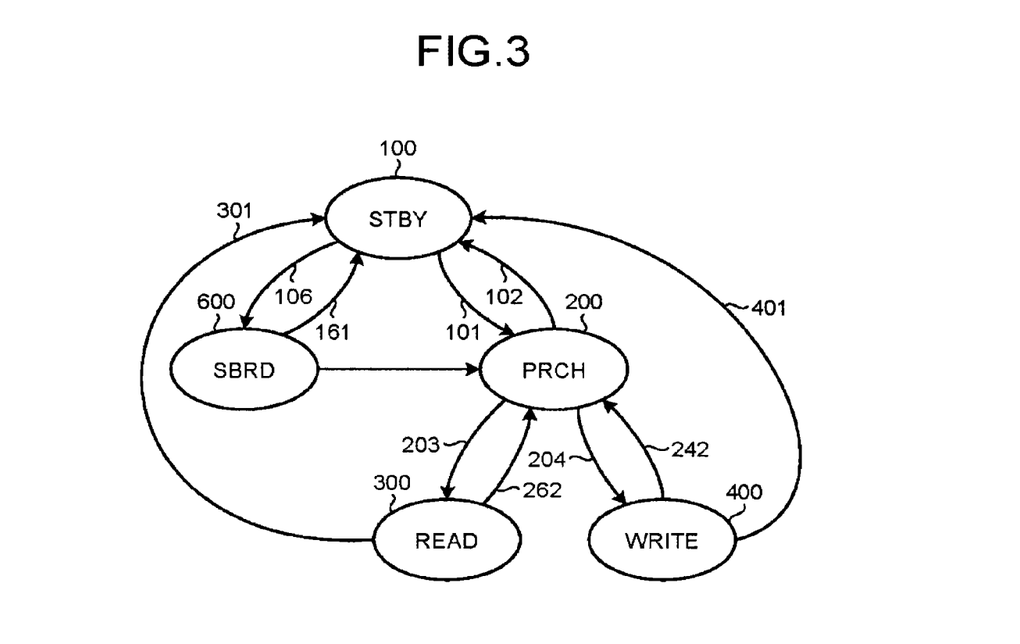
FIG. 3 is a diagram for describing a driving method of a semiconductor storage device of a third embodiment.

FIG. 3 is a diagram for describing a driving method of a semiconductor storage device of a third embodiment. The driving method is illustrated in a state transition diagram. The configurations corresponding to the above-described embodiment are denoted by the same symbols. In this embodiment, the standby mode (100), the SBRD mode (600), the pre-charge state (200), the read mode (300), and the write mode (400) in the respective modes described in FIG. 2 are included. The transition from the standby mode (100) to the SBRD mode (600) can be made by changing only the voltage of one of the select word line WL0 connected to the select memory cell VR1 or the select bit line BL1 connected to the select memory cell VR1.

In this embodiment, the SBRD mode (600) of directly reading the data of the select memory cell VR1 without entering the pre-charge state (200) is included. Therefore, the data can be rapidly read out of the select memory cell VR1. Since the transition is made to the SBRD mode (600) without entering the pre-charge state (200), a pre-charge state PRCH until the data is read out can be eliminated, and the power consumption can be reduced.

Fourth Embodiment

Figure 4:
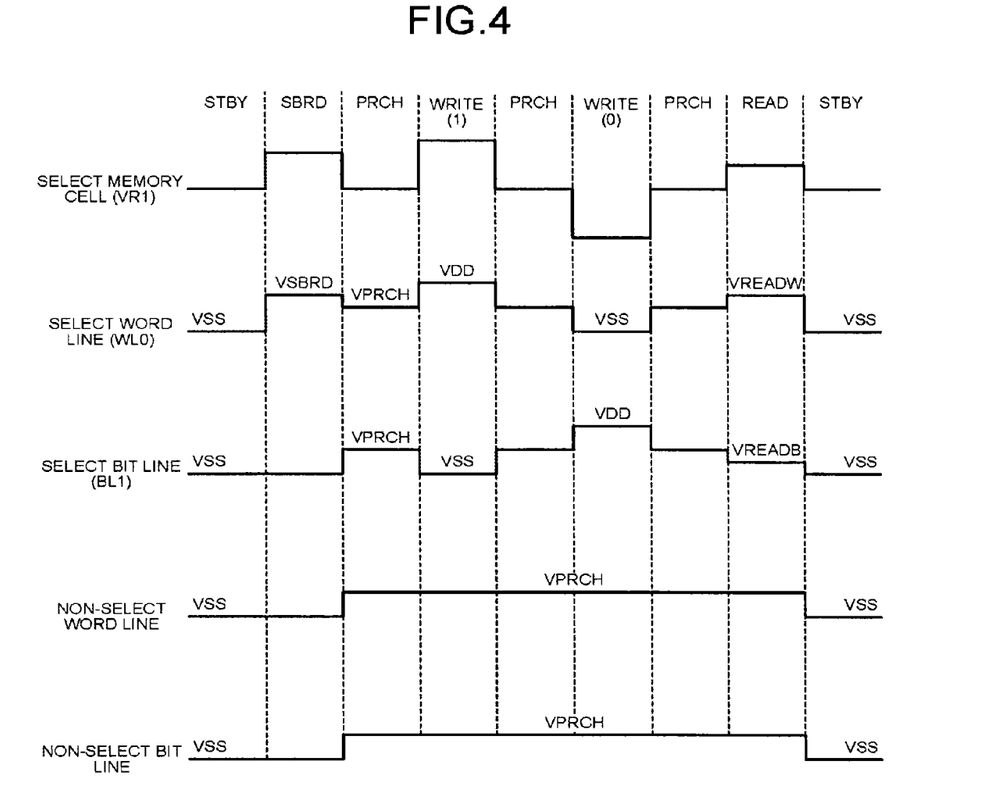
FIG. 4 is a diagram for describing a driving method of a semiconductor storage device of a fourth embodiment.

FIG. 4 is a diagram for describing a driving method of a semiconductor storage device of a fourth embodiment. In this embodiment, there is provided an embodiment of a driving method in a case where the standby mode STBY, the SBRD mode SBRD, the write mode WRITE, the read mode READ, and the pre-charge state PRCH are provided. This embodiment is an embodiment of a driving method corresponding to the embodiment illustrated in the state transition diagram of FIG. 3.

In the standby mode, the ground voltage VSS is applied to all the word lines (WL0 to WLn) and all the bit lines (BL0 to BLn). In a case where the transition is made from the standby mode to the SBRD mode and the data of the select memory cell VR1 is read, the SBRD voltage VSBRD is applied to the select word line WL0 connected to the select memory cell VR1. The SBRD voltage VSBRD is set to a voltage such that the resistance value of the select memory cell VR1 is not changed to prevent the data from being destroyed. In addition, an application time of the SBRD voltage VSBRD is set to a time not causing a change in a resistance value of the memory cell VR1 due to the application of the SBRD voltage VSBRD.

In this embodiment, the transition is made to the pre-charge state after the SBRD mode. For example, a pre-charge voltage PRCH voltage of the pre-charge voltage generation circuit 27 of the row control circuit 20 is applied to all the word lines (WL0 to WLn) through the row select circuit 21. In addition, at the same time, the pre-charge voltage PRCH voltage of the pre-charge voltage generation circuit 37 of the column control circuit 30 is applied to all the bit lines (BL0 to BLn) through the column select circuit 31.

In a case where the data "1" is written to the select memory cell VR1, for example, the power source voltage VDD is applied as the WRITE voltage to the select word line WL0. At the same time, the ground voltage VSS is applied as the WRITE voltage to the select bit line BL1. Therefore, the same voltage as the power source voltage VDD is applied between the both ends of the select memory cell VR1. The resistance value of the select memory cell VR1 is changed by applying the same voltage as the power source voltage VDD, and the data "1" can be written.

After the data "1" is written to the select memory cell VR1, a pre-charge voltage VPRCH is applied to all the word lines (WL0 to WLn) and all the bit lines (BL0 to BLn) to make the transition to the pre-charge state.

Next, in a case where the data "0" is written to the select memory cell VR1, for example, the ground voltage VSS is applied to the select word line WL0. At the same time, the power source voltage VDD is applied to the select bit line BL1. Therefore, between the both ends of the select memory cell VR1 is applied with a voltage charged with an opposite polarity to the voltage in a case where the data "1" having the absolute value equal to the power source voltage VDD is written. Therefore, the resistance value of the select memory cell VR1 is changed so that the data "0" can be written.

After the data "0" is written to the select memory cell VR1, the pre-charge voltage PRCH voltage is applied to all the word lines (WL0 to WLn) and all the bit lines (BL0 to BLn) to make the transition to the pre-charge state.

Next, the transition to the read mode READ of reading the data of the select memory cell VR1 is made. In the read mode READ, a read-out voltage VREADW is applied to the select word line WL0 connected to the select memory cell VR1. At the same time, a read-out voltage VREADB is applied to the select bit line BL1 connected to the select memory cell VR1. For example, the read-out voltage VREADW applied to the select word line WL0 is a voltage slightly higher than the pre-charge voltage VPRCH, and the read-out voltage VREADB applied to the select bit line BL0 is a voltage slightly lower than the pre-charge voltage VPRCH. A voltage difference between the read-out voltage VREADW applied to the select word line WL0 and the read-out voltage VREADB applied to the select bit line BL1 is set to a range where the resistance value of the select memory cell VR1 is changed to prevent the data from being destroyed.

In this embodiment, the SBRD mode is included in which the data is read out of the select memory cell VR1 only by changing the voltage of the select word line WL0 from the standby mode STBY where the ground voltage VSS is applied to all the word lines and all the bit lines. Therefore, the data of the select memory cell VR1 can be rapidly read without entering the pre-charge state. In addition, since the transition to the SBRD mode is made without entering the pre-charge state, it is possible to reduce the power consumption which is caused by entering the pre-charge state.

Fifth Embodiment

Figure 5:
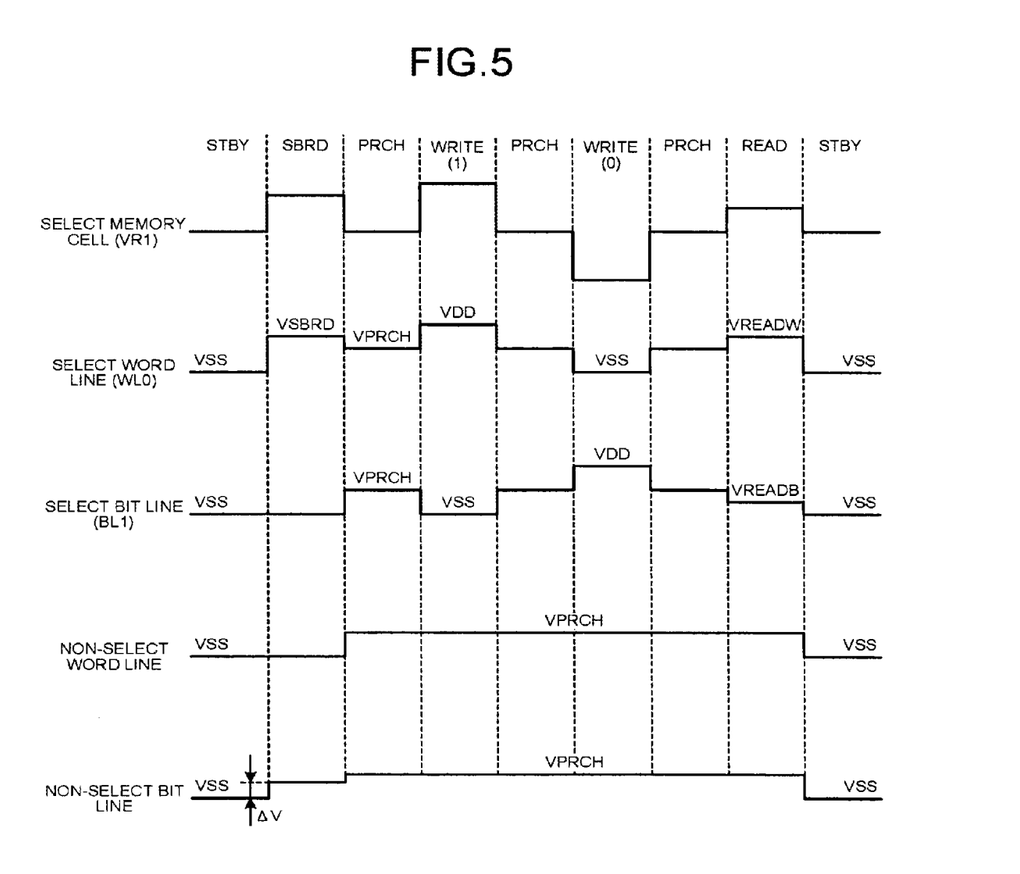
FIG. 5 is a diagram for describing a driving method of a semiconductor storage device of a fifth embodiment.

FIG. 5 is a diagram illustrating a driving method of a semiconductor storage device of a fifth embodiment. In this embodiment, in the SBRD mode, the potential of a non-select bit line is increased by a voltage of ΔV. Therefore, since a voltage difference between the non-select bit lines (BL1 to BLn) connected to non-select variable resistive elements VR and the select word line WL0 becomes small, the power consumption can be reduced.

Although the potential of the non-select bit line is increased by a voltage of ΔV so as to generate the voltage difference between a non-select bit line and a non-select word line, it is possible to avoid that a current flows through the non-selected variable resistive element between the non-select bit line and the non-select word line caused by the application of the voltage ΔV using the variable resistive element having a non-linear characteristic in which a current dose not flow at a small voltage. The transition of the operation mode after the SBRD mode is similar to the case of the fourth embodiment.

In this embodiment, the potential of the non-select bit line is increased by the voltage ΔV in the SBRD mode. Therefore, since the voltage difference between the non-select bit line connected to the non-select variable resistive elements VR and the select word line becomes small, the power consumption can be reduced. The power consumption in the SBRD mode can be suppressed.

Sixth Embodiment

Figure 6:
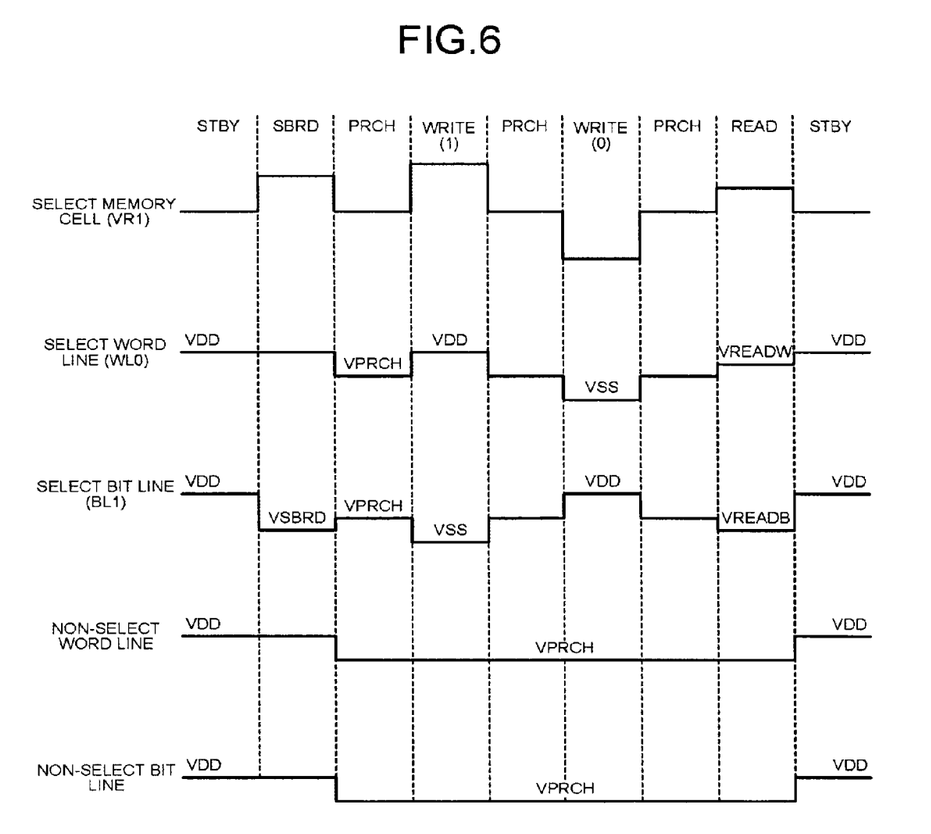
FIG. 6 is a diagram for describing a driving method of a semiconductor storage device of a sixth embodiment.

FIG. 6 is a diagram for describing a driving method of a semiconductor storage device of a sixth embodiment. In this embodiment, the power source voltage VDD is applied to all the word lines (WL0 to WLn) and all the bit lines (BL0 to BLn) in the standby mode.

In this embodiment, only the voltage of the select bit line BL1 connected to the select memory cell VR1 falls down to the SBRD voltage VSBRD in the SBRD mode. Therefore, the voltage difference (VDD−VSBRD) is generated in both ends of the select memory cell VR1, and the data of the select memory cell VR1 is read by the voltage difference.

Hereinafter, the transition to the standby mode is made through the pre-charge state, a WRITE (1) of data (1), the pre-charge state, a WRITE (0) of data (0), the pre-charge state, and the read mode READ.

In this embodiment, the SBRD mode is included after the standby mode where the power source voltage VDD is applied to all the word lines (WL0 to WLn) and all the bit lines (BL0 to BLn), and in the SBRD mode, the data is read out of the select memory cell VR1 by changing only the voltage of the select bit line BL1. Therefore, the data of the select memory cell VR1 can be rapidly read without entering the pre-charge state. In addition, since the transition is directly made from the standby mode to the SBRD mode, it is possible to reduce the power consumption which is caused by entering the pre-charge state.

Seventh Embodiment

Figure 7:
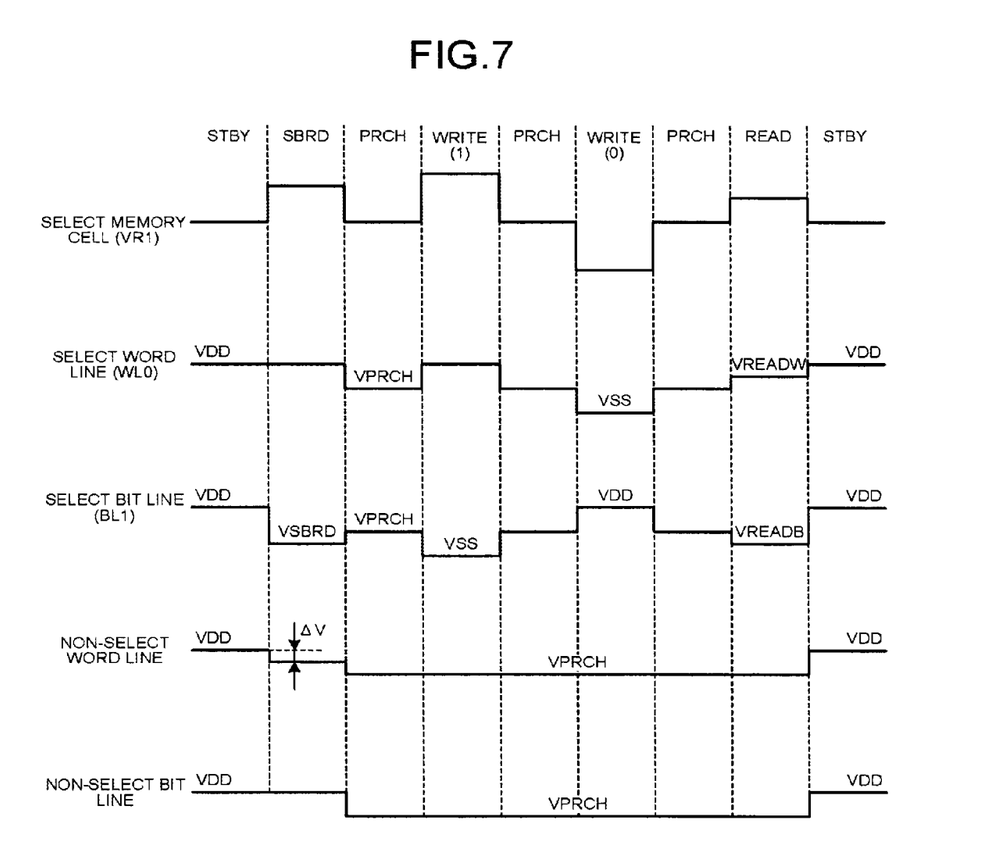
FIG. 7 is a diagram for describing a driving method of a semiconductor storage device of a seventh embodiment.

FIG. 7 is a diagram for describing a driving method of a semiconductor storage device of a seventh embodiment. In this embodiment, in the SBRD mode, the potential of the non-select word lines (WL1 to WLn) is dropped or decreased by a voltage of ΔV. Therefore, since the voltage difference between the non-select word lines (WL1 to WLn) connected to the non-select variable resistive element VR and the select bit line BL1 becomes small, the power consumption can be reduced.

Although the potential of the non-select word line is decreased by a voltage of ΔV so as to generate the voltage difference between the non-select word line and the non-select bit line, it is possible to avoid that a current flows through the non-select variable resistive element by the application of the voltage difference ΔV generated between the non-select word line and the non-select bit line using the variable resistive element having a non-linear characteristic in which a current does not flow at a small voltage. The transition of the operation mode after the SBRD mode is similar to the case of the sixth embodiment.

In this embodiment, in the SBRD mode, the potential of the non-select word line is dropped by a voltage not causing a change in the resistance value of the variable resistive element. Therefore, the power consumption can be reduced in the SBRD mode.

Eighth Embodiment

Figure 8:
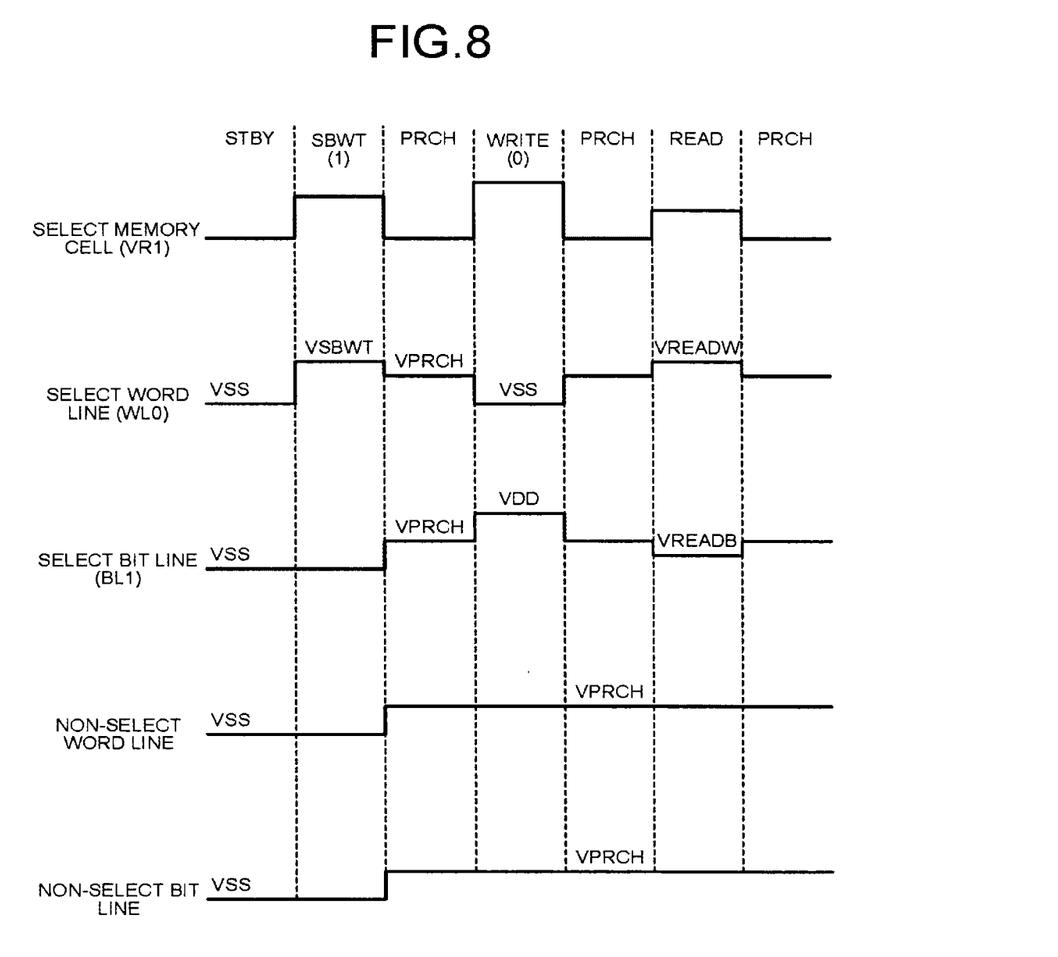
FIG. 8 is a diagram for describing a driving method of a semiconductor storage device of an eighth embodiment.

FIG. 8 is a diagram for describing a driving method of a semiconductor storage device of an eighth embodiment. In this embodiment, the SBWT mode is included in which the data "1" is written to the select memory cell after the standby mode. In other words, the SBWT mode is included after the standby mode in which the ground voltage VSS is applied to all the word lines (WL0 to WLn) and all the bit lines (BL0 to BLn), and in the SBWT mode, the data is written to the select memory cell VR1 by applying the increased SBWT voltage VSBWT to the select word line WL0.

In a case where the data "0" and "1" is written to the variable resistive element VR in different voltages, the SBWT mode can be used when the data requiring a lower voltage for the writing is written.

After the SBWT mode, the transition is made to the pre-charge state. In the pre-charge state, the pre-charge voltage VPRCH is applied to all the word lines (WL0 to WLn) and all the bit lines (BL0 to BLn).

Next, the data "0" is written to the select memory cell VR1. The ground voltage VSS is applied to the select word line WL0 as the write voltage, and the power source voltage VDD is applied to the select bit line BL1 as the write voltage, so that the data "0" is written to the select memory cell VR1.

After the data "0" is written, the transition is made to the pre-charge state. In the pre-charge state, the pre-charge voltage VPRCH is applied to all the word lines (WL0 to WLn) through the row select circuit 21, and the pre-charge voltage VPRCH is applied to all the bit lines (BL0 to BLn) from the column select circuit 31.

In the read mode READ, the read-out voltage VREADW is applied to the select word line WL0, and the read-out voltage VREADB is applied to the select bit line BL1. The read-out voltage VREADW is a voltage slightly higher than the pre-charge voltage VPRCH, and the read-out voltage VREADB is a voltage slightly lower than the pre-charge voltage VPRCH. The voltage difference (VREADW−VREADB) between the read-out voltage VREADW and the read-out voltage VREADB is used to read the data out of the select memory cell VR1.

According to this embodiment, the SBWT mode is included in which the data is directly written to the select memory cell VR1 without entering the pre-charge state from the standby mode. Therefore, the data can be rapidly written to the select memory cell VR1 without entering the pre-charge state. In addition, since the transition is directly made from the standby mode to the SBWT mode, it is possible to reduce the power consumption which is caused by entering the pre-charge state.

Figure 9:
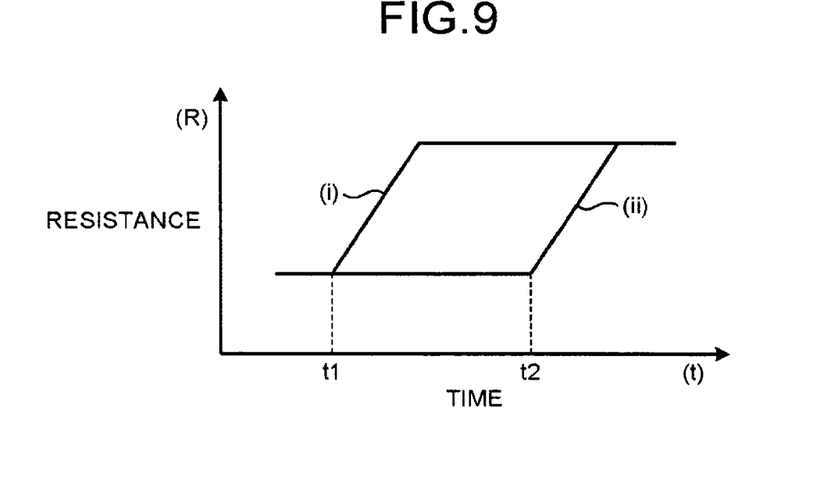
FIG. 9 is a diagram for describing a characteristic of a variable resistive element.

FIG. 9 is a diagram for describing a characteristic of the variable resistive element. The horizontal axis indicates a voltage application time (t), and the vertical axis indicates resistance (R). As the characteristic of the variable resistive element VR as the memory cell of the above-mentioned embodiment, for example, in a case where a high voltage (for example, the power source voltage VDD) is applied between the both ends of the variable resistive element VR, the resistance value is increased at a timing of t1 as indicated with a solid line (i). In a case where a low voltage (for example, an intermediate voltage between the power source voltage VDD and the ground voltage VSS) is applied between the both ends of the variable resistive element VR, the resistance value is increased at a timing of t2 as indicated with a solid line (ii). Therefore, the data corresponding to the resistance value can be written to the select memory cell VR1 according to the applied voltage and the setting of the application time.

Ninth Embodiment

Figure 10:
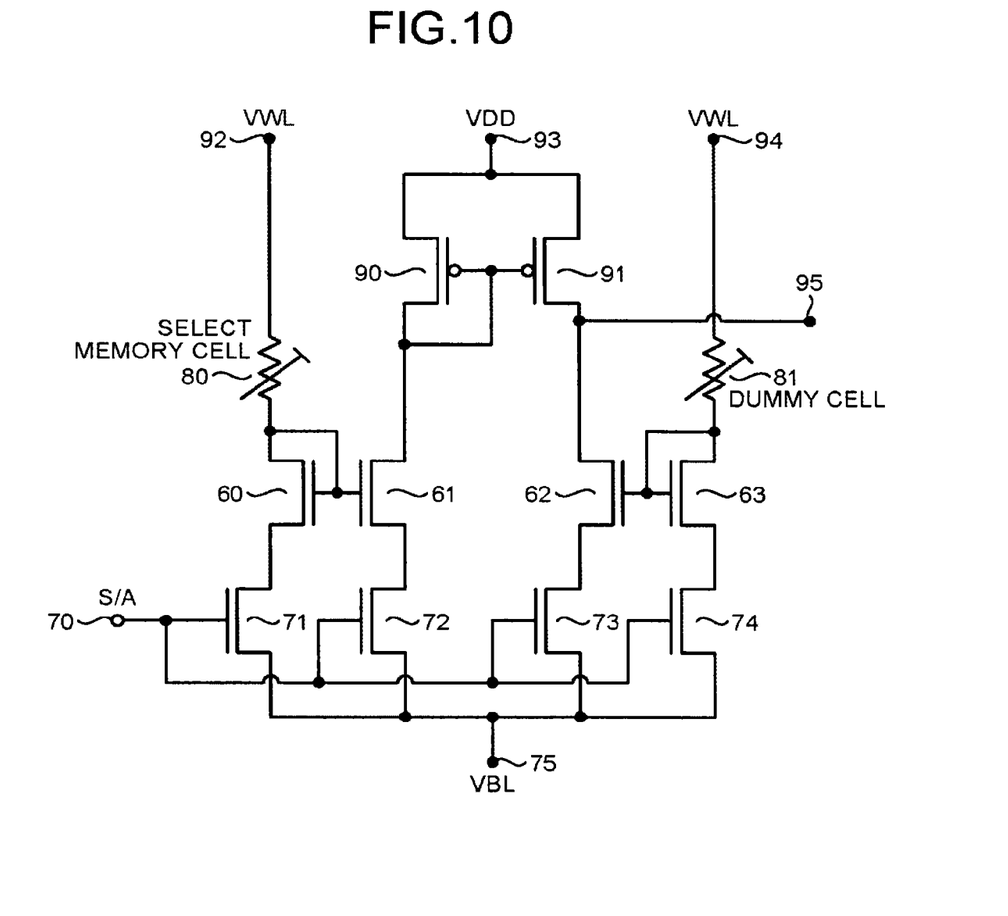
FIG. 10 is a diagram illustrating an embodiment of a sensor amplifier.

FIG. 10 is a diagram illustrating an embodiment of a sense amplifier which can be used to read a data written in the select memory cell in the above-described embodiments. The sense amplifier of this embodiment includes a terminal 92 which is connected to one end of a select memory cell 80. A voltage VWL of the select word line is applied to the terminal 92. A terminal 94 is connected to one end of a dummy cell 81. The dummy cell 81 has a resistance value corresponding to the predetermined data "1" or "0". As the dummy cell 81, the variable resistive element VR is used similarly to the select memory cell 80. The voltage VWL of the select word line is applied to the terminal 94.

The other end of the select memory cell 80 is connected to the drain and the gate of an NMOS transistor 60. The gate of an NMOS transistor 61 is connected to the gate of the NMOS transistor 60. The NMOS transistors 60 and 61 serve as a current mirror circuit. The source of the NMOS transistor 60 is connected to the drain of an NMOS transistor 71. The source of the NMOS transistor 61 is connected to the drain of an NMOS transistor 72.

The other end of the dummy cell 81 is connected to the drain and the gate of an NMOS transistor 63. The gate of the NMOS transistor 62 is connected to the gate of the NMOS transistor 63. The NMOS transistors 62 and 63 serve as the current mirror circuit. The source of the NMOS transistor 63 is connected to the drain of an NMOS transistor 74. The source of the NMOS transistor 62 is connected to the drain of the NMOS transistor 73. The gates of the NMOS transistors 71 to 74 are connected to a terminal 70. A control signal S/A is applied to the terminal 70 to control the operation of the sensor amplifier. When the control signal S/A is at the H level, the sensor amplifier is operated to make the read operation. The sources of the NMOS transistors (71 to 74) are connected to a terminal 75. A voltage VBL applied to the select bit line BL1 is applied to the terminal 75.

The drain of the NMOS transistor 62 is connected to the drain of a PMOS transistor 91. The drain of the NMOS transistor 61 is connected to the drain and the gate of the PMOS transistor 90. The gate of the PMOS transistor 90 is connected to the gate of a PMOS transistor 91. The PMOS transistors 90 and 91 serve as the current mirror circuit. The sources of the PMOS transistors (90 and 91) are connected to a terminal 93. The power source voltage VDD is applied to the terminal 93.

At the time of the read operation (SBRD and READ), the control signal S/A applied to the terminal 70 comes to be at the H level. The NMOS transistors 71 to 74 are turned on by the control signal S/A, and the current is supplied to the select memory cell 80 and the dummy cell 81. The output voltage of a terminal 95 is different according to a difference of the resistance value between the select memory cell 80 and the dummy cell 81. In a case where the resistance of the select memory cell 80 is smaller than that of the dummy cell 81, the gate voltage of the PMOS transistor 90 and the PMOS transistor 91 serving as the current mirror circuit is decreased, the drain voltage of the PMOS transistor 91 is increased, and the voltage of the terminal 95 comes to be at the High level. On the contrary, in a case where the resistance of the select memory cell 80 is larger than that of the dummy cell 81, the gate voltage of the PMOS transistor 90 and the PMOS transistor 91 serving as the current mirror circuit is increased and the drain voltage of the PMOS transistor 91 is decreased, so that the voltage of the terminal 95 comes to be at the Low level. Since a magnitude relation between the resistance value of the select memory cell 80 and the resistance value of the dummy cell 81 can be obtained by measuring the voltage of the terminal 95, the data written in the select memory cell 80 can be read.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device which is provided with a variable resistive element as a memory element, the variable resistive element being connected between a word line and a bit line to change a resistance value according to a polarity of a voltage applied between the word line and the bit line and a magnitude of the voltage, the semiconductor storage device comprising:
- a control circuit which controls to apply a voltage to the variable resistive element in a standby mode, a pre-charge mode, a first read mode, and a first write mode, wherein the control circuit is configured:
  - to apply a power source voltage on a high potential side or a ground voltage to both of the word line and the bit line in the standby mode;
  - to apply a predetermined pre-charge voltage to both of the word line and the bit line in the pre-charge mode, wherein the pre-charge voltage is set to an intermediate voltage between the power source voltage on the high potential side and the ground voltage;
  - to apply a voltage equal to or more than a first voltage between the word line and the bit line, by changing the pre-charge voltage of both of the word line and the bit line so as to change a resistance value of the memory element, to write data to the memory element in the first write mode, wherein the first write mode is transitioned to from the pre-charge mode;
  - to apply a voltage smaller than the first voltage between the word line and the bit line by changing the pre-charge voltage of both of the word line and the bit line so as to read data written in the memory element in the first read mode, wherein the first read mode is transitioned to from the pre-charge mode,
  - to apply a voltage to the variable resistive element in at least one mode of a second read mode and a second write mode,
  - to apply a voltage smaller than the first voltage between the word line and the bit line by changing the voltage of only one of the word line and the bit line, which is applied in the standby mode, so as to read data written in the memory element in the second read mode, wherein the second read mode is directly transitioned to from the standby mode, and
  - to apply a voltage smaller than the first voltage between the word line and the bit line, by changing the voltage of only one of the word line and the bit line which is applied in the standby mode so as to change the resistance value of the memory element, to write data to the memory element in the second write mode, wherein the second write mode is directly transitioned from the standby mode.

2. The semiconductor storage device according to claim 1, wherein
the ground voltage is applied to the word line and the bit line in the standby mode, and a voltage higher than the ground voltage by a predetermined voltage is applied to the word line to apply the voltage smaller than the first voltage between the word line and the bit line in the second read mode.

3. The semiconductor storage device according to claim 1, wherein
the power source voltage on the high potential side is applied to the word line and the bit line in the standby mode, and a voltage lower than the power source voltage by a predetermined voltage is applied to the bit line to apply the voltage smaller than the first voltage between the word line and the bit line in the second read mode.

4. The semiconductor storage device according to claim 1, wherein the first data write mode includes a third write mode in which first data is written by applying the power source voltage on the high potential side to the word line and applying the ground voltage to the bit line, and a fourth write mode in which second data is written by applying the ground voltage to the word line and applying the power source voltage on the high potential side to the bit line.

5. A driving method of a semiconductor storage device which is provided with a variable resistive element as a memory element, the variable resistive element being connected between a word line and a bit line to change a resistance value according to a polarity of a voltage applied between the word line and the bit line and a magnitude of the voltage, the driving method comprising:
- applying a power source voltage on a high potential side or a ground voltage to both of the word line and the bit line in a standby mode;
- applying a predetermined pre-charge voltage to both of the word line and the bit line in a pre-charge mode, wherein the pre-charge voltage is set to an intermediate voltage between the power source voltage on the high potential side and the ground voltage;
- applying first voltage between the word line and the bit line, by changing the pre-charge voltage of both of the word line and the bit line so as to change a resistance value of the memory element, to write a data to the memory element in a first write mode, wherein the first write mode is transitioned to from the pre-charge mode; and
- applying a voltage smaller than the first voltage between the word line and the bit line by changing the pre-charge voltage of both of the word line and the bit line so as to read data written in the memory element in a first read mode, wherein the first read mode is transitioned to from the pre-charge mode;
- applying a voltage smaller than the first voltage between the word line and the bit line in at least one mode of a second read mode and a second write mode,
- wherein the applying the voltage in the second read mode includes applying a voltage smaller than the first voltage between the word line and the bit line by changing the voltage of only one of the word line and the bit line which is applied in the standby mode, so as to read data written in the memory element in the second read mode, wherein the second read mode is directly transitioned to from the standby mode, and
- wherein the applying the voltage in the second write mode includes applying a voltage smaller than the first voltage between the word line and the bit line, by changing the voltage of only one of the word line and the bit line which is applied in the standby mode, so as to change the resistance value of the memory element, to write data to the memory element in the second write mode, wherein the second write mode is directly transitioned to from the standby mode.

6. The driving method of the semiconductor storage device according to claim 5, wherein
the applying the voltage smaller than the first voltage in the second read mode includes increasing a voltage of the word line to be a voltage higher than the ground voltage by a predetermined voltage, wherein the ground voltage is applied to the word line and the bit line in the standby mode.

7. The driving method of the semiconductor storage device according to claim 5, wherein the applying the voltage smaller than the first voltage in the second read mode includes decreasing a voltage of the bit line to be a voltage lower than the power source voltage by a predetermined voltage, wherein the power source voltage on the high potential side is applied to the word line and the bit line in the standby mode.

8. The driving method of the semiconductor storage device according to claim 7, further comprising applying the pre-charge voltage to both of the word line and the bit line, subsequently to the applying the voltage to read the data written in the memory element in the second read mode.

9. The driving method of the semiconductor storage device according to claim 8, further comprising applying the first voltage between the word line and the bit line to write a data to the memory element, subsequently to the applying the pre-charge voltage to both of the word line and the bit line.

10. The driving method of the semiconductor storage device according to claim 5, further comprising applying the pre-charge voltage to both of the word line and the bit line subsequently to the changing the voltage of only one of the voltages applied to the word line and the bit line in the second read mode.

11. The driving method of the semiconductor storage device according to claim 10, further comprising applying the first voltage between the word line and the bit line to write a data to the memory element, subsequently to applying the pre-charge voltage to the word line and the bit line.

12. The driving method of the semiconductor storage device according to claim 5, wherein
the semiconductor storage device includes a plurality of word lines, a plurality of bit lines, and a plurality of variable resistive elements, the variable resistive element being connected correspondingly to the word line and the bit line and being changed in a resistance value by a voltage applied to both ends thereof,
the power source voltage on the high potential side or the ground voltage is applied to both of all the plurality of word lines and all the plurality of bit lines in the standby mode,
the applying the voltage to write includes applying a voltage smaller than the first voltage between the word line and the bit line connected to a variable resistive element selected in the plurality of variable resistive elements in the plurality of word lines and the plurality of bit lines in the second write mode, wherein
the applying the voltage to read in the second write mode includes changing the voltage of one of the word line and the bit line connected to a variable resistive element selected in the plurality of variable resistive elements in the plurality of word lines and the plurality of bit lines.

13. The driving method of the semiconductor storage device according to claim 12, further comprising increasing a voltage of the bit lines other than the bit line connected to the selected variable resistive element by a predetermined voltage in a case where the ground voltage is applied to the plurality of word lines and the plurality of bit lines in the standby mode, upon applying the voltage to read in the second read mode.

14. The driving method of the semiconductor storage device according to claim 12, further comprising decreasing a voltage of the word lines other than the word line connected to the selected variable resistive element by a predetermined voltage in a case where the power source voltage on the high potential side is applied to the plurality of word lines and the plurality of bit lines in the standby mode upon applying the voltage to read in the second read mode.

15. A semiconductor storage device comprising:
a plurality of word lines;
a plurality of bit lines;
a plurality of variable resistive elements, each of which is connected correspondingly to the word line and the bit line and is changed in a resistance value by a voltage applied to both ends thereof; and
a control circuit configured to:
apply a predetermined voltage to the plurality of word lines and the plurality of bit lines in a standby mode, a pre-charge mode, a first write mode, and a first read mode,
apply a power source voltage on a high potential side or a ground voltage to both of the plurality of word lines and the plurality of bit lines in the standby mode;
apply a predetermined pre-charge voltage to both of the word lines and the bit lines in the pre-charge mode, wherein the pre-charge voltage is set to an intermediate voltage between the power source voltage on the high potential side and the ground voltage;
apply a first voltage between the word line and the bit line connected to a selected variable resistive element, by changing the pre-charge voltage of both of the word line and the bit line so as to change the resistance value of the memory element, to write data to the selected variable resistive element in the first write mode, wherein the first write mode is transitioned to from the pre-charge mode;
apply a voltage smaller than the first voltage between the word line and the bit line connected to the selected variable resistive element by changing the pre-charge voltage of both of the word line and the bit line so as to read data written in the selected variable resistive element in the first read mode, wherein the first read mode is transitioned to from the pre-charge mode,
apply a predetermined voltage to the variable resistive element in at least one of a second read mode and a second write mode,
apply a voltage smaller than the first voltage between the word line and the bit line connected to the selected variable resistive element by changing the voltage of only one of the word line and the bit line which is applied in the standby mode, so as to read data written in the memory element in the second read mode, wherein the second read mode is directly transitioned to from the standby mode, and
apply a voltage smaller than the first voltage between the word line and the bit line connected to the selected variable resistive element, by changing the voltage of only one of the word line and the bit line which is applied in the standby mode, so as to change the resistance value of the memory element, to write data to the memory element in the second write mode, wherein the second write mode is directly transitioned to from the standby mode.

16. The semiconductor storage device according to claim 15, wherein
the control circuit drops a voltage of the word lines other than the word line connected to the selected variable resistive element in the second read mode by a predetermined voltage in a case where the power source voltage on the high potential side is applied to the plurality of word lines and the plurality of bit lines in the standby mode.

17. The semiconductor storage device according to claim 15, wherein
the control circuit increases a voltage of the bit lines other than the bit line connected to the selected variable resistive element in the second read mode by a predetermined voltage in a case where the ground voltage is applied to the plurality of word lines and the plurality of bit lines in the standby mode.

* * * * *